United States Patent
Shappir et al.

(10) Patent No.: US 10,915,394 B1
(45) Date of Patent: Feb. 9, 2021

(54) SCHEMES FOR PROTECTING DATA IN NVM DEVICE USING SMALL STORAGE FOOTPRINT

(71) Applicant: Apple Inc., Cupertino, CA (US)

(72) Inventors: Assaf Shappir, Ganey Tikva (IL); Stas Mouler, Kfar Saba (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/578,353

(22) Filed: Sep. 22, 2019

(51) Int. Cl.
| G11C 29/00 | (2006.01) |
| G06F 11/10 | (2006.01) |
| G06F 11/07 | (2006.01) |
| G06F 11/14 | (2006.01) |
| H01L 21/822 | (2006.01) |
| G11C 11/408 | (2006.01) |
| G11C 11/409 | (2006.01) |
| G11C 29/44 | (2006.01) |

(52) U.S. Cl.
CPC ...... *G06F 11/1016* (2013.01); *G06F 11/0793* (2013.01); *G06F 11/1451* (2013.01); *G11C 11/409* (2013.01); *G11C 11/4085* (2013.01); *G11C 29/44* (2013.01); *H01L 21/8221* (2013.01)

(58) Field of Classification Search
None
See application file for complete search history.

(56) References Cited

U.S. PATENT DOCUMENTS

| 4,841,482 A | 6/1989 | Kreifels |
| 5,181,025 A | 1/1993 | Ferguson et al. |
| 5,331,594 A | 7/1994 | Hotta |
| 5,372,712 A | 12/1994 | Petit |
| 5,428,621 A | 6/1995 | Mehrotra et al. |
| 5,440,516 A | 8/1995 | Slemmer |
| 5,581,509 A | 12/1996 | Golla et al. |
| 5,602,778 A | 2/1997 | Futatsuya et al. |
| 5,606,527 A | 2/1997 | Kwack et al. |
| 5,684,747 A | 11/1997 | Urai |
| 5,748,545 A | 5/1998 | Lee et al. |
| 5,796,653 A | 8/1998 | Gaultier |
| 5,847,995 A | 12/1998 | Kobayashi et al. |
| 5,898,637 A | 4/1999 | Lakhani et al. |
| 6,031,772 A | 2/2000 | Nagatomo |

(Continued)

OTHER PUBLICATIONS

U.S. Appl. No. 16/202,127 office action dated Dec. 11, 2019.

(Continued)

*Primary Examiner* — Guerrier Merant

(57) ABSTRACT

A memory system includes a Nonvolatile Memory (NVM) and storage circuitry. The NVM includes memory cells organized in multiple memory blocks that each includes multiple Word Lines (WLs). The storage circuitry assigns in a recovery scheme, data pages to predefined parity groups, including assigning to a parity group multiple data pages of two or more different bit-significance values in a common group of the memory cells in a WL. The storage circuitry calculates redundancy data over the data pages of a given parity group in accordance with the recovery scheme and stores the redundancy data in a dedicated group of the memory cells. The storage circuitry reads a data page belonging to the given parity group, and upon detecting a read failure, recovers the data page based on other data pages in the given parity group and on the redundancy data calculated for the given parity group.

20 Claims, 4 Drawing Sheets

(56) References Cited

U.S. PATENT DOCUMENTS

| | | |
|---|---|---|
| 6,545,910 B2 | 4/2003 | Byeon et al. |
| 6,650,585 B2 | 11/2003 | Chevallier |
| 6,707,078 B1 | 3/2004 | Shiraiwa et al. |
| 6,813,183 B2 | 11/2004 | Chevallier |
| 7,089,460 B2 | 8/2006 | Fu |
| 7,212,454 B2 | 5/2007 | Kleveland et al. |
| 7,319,623 B1 | 1/2008 | Yuan et al. |
| 7,440,347 B1 | 10/2008 | Vogelsang |
| 7,463,529 B2 | 12/2008 | Matsubara |
| 7,856,528 B1 | 12/2010 | Frost et al. |
| 7,873,803 B2 | 1/2011 | Cheng |
| 8,176,284 B2 | 5/2012 | Frost et al. |
| 8,305,807 B2 | 11/2012 | Shah et al. |
| 8,379,454 B2 | 2/2013 | Kochar et al. |
| 8,432,732 B2 | 4/2013 | Li et al. |
| 8,473,780 B2 | 6/2013 | Shalvi |
| 8,478,796 B2 | 7/2013 | Post et al. |
| 8,514,630 B2 | 8/2013 | Huynh et al. |
| 8,645,749 B2 | 2/2014 | Reche |
| 8,645,776 B2 | 2/2014 | Byom et al. |
| 8,730,722 B2 | 5/2014 | Koh et al. |
| 8,732,557 B2 | 5/2014 | Ratnam et al. |
| 8,767,459 B1 | 7/2014 | Kasorla et al. |
| 8,775,901 B2 | 7/2014 | Sharon et al. |
| 8,832,357 B2 | 9/2014 | Yao et al. |
| 8,892,981 B2 | 11/2014 | Post et al. |
| 8,902,657 B2 | 12/2014 | Iwai et al. |
| 8,977,813 B2 | 3/2015 | Burd |
| 9,021,339 B2 | 4/2015 | Lu et al. |
| 9,021,343 B1 | 4/2015 | Hu et al. |
| 9,032,272 B2 | 5/2015 | Yoon et al. |
| 9,053,809 B2 | 6/2015 | Anholt et al. |
| 9,058,261 B1 | 6/2015 | Jean et al. |
| 9,092,363 B2 | 7/2015 | Avila et al. |
| 9,105,349 B2 | 8/2015 | Avila et al. |
| 9,128,822 B2 | 9/2015 | Michael et al. |
| 9,135,112 B2 | 9/2015 | Chen et al. |
| 9,177,610 B2 | 11/2015 | D'Abreu et al. |
| 9,330,783 B1 | 5/2016 | Rotbard et al. |
| 9,355,713 B2 | 5/2016 | Huang et al. |
| 9,390,809 B1 | 7/2016 | Shur et al. |
| 9,406,346 B2 | 8/2016 | D'Abreu et al. |
| 9,454,429 B2 | 9/2016 | Ojalvo et al. |
| 9,489,263 B2 | 11/2016 | Hyun et al. |
| 9,529,663 B1 | 12/2016 | Srinvasan et al. |
| 9,619,321 B1 | 4/2017 | Haratsch et al. |
| 9,811,413 B2 | 11/2017 | Ojalvo et al. |
| 9,847,141 B1 | 12/2017 | Sagiv et al. |
| 9,928,126 B1 | 3/2018 | Shappir et al. |
| 9,959,168 B2 | 5/2018 | Achtenberg et al. |
| 9,984,771 B2 | 5/2018 | Bonke |
| 9,996,417 B2 | 6/2018 | Shappir et al. |
| 10,474,530 B2 | 11/2019 | Yeh |
| 10,740,476 B2 | 8/2020 | Shappir et al. |
| 2002/0174295 A1 | 11/2002 | Ulrich et al. |
| 2008/0052446 A1 | 2/2008 | Lasser et al. |
| 2009/0157964 A1 | 6/2009 | Kasorla et al. |
| 2009/0225607 A1 | 9/2009 | Chen et al. |
| 2010/0128525 A1 | 5/2010 | Mokhlesi |
| 2010/0329052 A1 | 12/2010 | Chen et al. |
| 2011/0066793 A1 | 3/2011 | Burd |
| 2011/0209028 A1 | 8/2011 | Post et al. |
| 2012/0148255 A1 | 6/2012 | Liu et al. |
| 2012/0159281 A1 | 6/2012 | Shalvi et al. |
| 2013/0024748 A1 | 1/2013 | Sharon et al. |
| 2013/0031429 A1 | 1/2013 | Sharon et al. |
| 2013/0117606 A1 | 5/2013 | Anholt et al. |
| 2013/0229868 A1 | 9/2013 | Koh et al. |
| 2013/0268724 A1 | 10/2013 | Seo et al. |
| 2013/0294168 A1 | 11/2013 | Shirakawa |
| 2014/0047291 A1 | 2/2014 | Shalvi et al. |
| 2014/0095259 A1 | 3/2014 | Tam et al. |
| 2014/0157078 A1 | 6/2014 | Danilak et al. |
| 2014/0189421 A1 | 7/2014 | Werner et al. |
| 2014/0189438 A1 | 7/2014 | Arbel et al. |
| 2014/0254264 A1 | 9/2014 | Dutta et al. |
| 2014/0269071 A1 | 9/2014 | Pandya et al. |
| 2014/0321202 A1 | 10/2014 | Yang et al. |
| 2015/0154069 A1 | 6/2015 | Tuers et al. |
| 2015/0178150 A1 | 6/2015 | Silberman et al. |
| 2016/0034353 A1 | 2/2016 | Tuers et al. |
| 2016/0098216 A1 | 4/2016 | Huang et al. |
| 2018/0203774 A1 | 7/2018 | Srinivasan et al. |
| 2019/0095116 A1 | 3/2019 | Igahara et al. |
| 2019/0198113 A1 | 6/2019 | Ben-Rubi et al. |
| 2019/0317672 A1 | 10/2019 | Linnen et al. |

OTHER PUBLICATIONS

U.S. Appl. No. 16/202,130 office action dated Jan. 8, 2020.
Yazovitsky et al., U.S. Appl. No. 16/202,127, filed Nov. 28, 2018.
Shappir et al., U.S. Appl. No. 16/202,130, filed Nov. 28, 2018.
Yazovitsky et al., U.S. Appl. No. 16/271,907, filed Feb. 11, 2019.
U.S. Appl. No. 16/271,907 Office Action dated Aug. 18, 2020.

US 10,915,394 B1

SCHEMES FOR PROTECTING DATA IN NVM DEVICE USING SMALL STORAGE FOOTPRINT

TECHNICAL FIELD

Embodiments described herein relate generally to data storage, and particularly to methods and systems for protecting data in NVM storage device using small memory footprint.

BACKGROUND

Non-Volatile Memory (NVM) devices are subject to various failures, e.g., due to imperfect manufacturing process. Such failures include, for example, word-line to substrate and word-line to word-line short or leakage, which may result in data loss in programming, reading or both.

SUMMARY

An embodiment that is described herein provides a memory system including a Nonvolatile Memory (NVM) and storage circuitry. The Nonvolatile Memory (NVM) includes multiple memory cells, the memory cells are organized in multiple memory blocks, and each memory block includes multiple Word Lines (WLs) of the memory cells. The storage circuitry is configured to assign in a recovery scheme data pages to multiple predefined parity groups, including assigning to a parity group multiple data pages of two or more different bit-significance values in a common group of the memory cells belonging to a given WL, to calculate redundancy data over the data pages of a given parity group in accordance with the recovery scheme, and to store the calculated redundancy data in a dedicated group of the memory cells. The storage circuitry is further configured to read a selected data page that belongs to the given parity group, and upon detecting a failure in reading the selected data page, to identify the given parity group in accordance with the recovery scheme, and recover the selected data page based on other data pages belonging to the given parity group and on the redundancy data calculated for the given parity group.

In some embodiments, the storage circuitry is configured to calculate the redundancy data over at least a first data page having a first bit-significance value and a second data page having a second different bit-significance value, both the first data page and the second data page are stored in the common group of the memory cells. In other embodiments, the storage circuitry is configured to assign to the given parity group multiple data pages belonging to multiple different groups of the memory cells.

In an embodiment, the multiple groups of the memory cells belong to a same WL across multiple planes of the memory blocks. In another embodiment, the memory cells are organized in a Three-Dimensional (3D) configuration in which each memory block includes multiple strings, and the multiple memory groups belong to a same WL across multiple respective strings of a same memory block. In yet another embodiment, the storage circuitry is configured to calculate the redundancy data by applying a bitwise XOR operation among the data pages assigned to the given parity group, and to recover the selected page by applying a bitwise XOR operation among the other data pages of the given parity group and the redundancy data.

In some embodiments, each WL includes four or more data pages of four or more different respective bit-significance values, and the storage circuitry is configured to assign a first pair of data pages having first and second bit-significance values in the common group of the memory cells to a first parity group, and to assign a second pair of data pages having third and fourth bit-significance values in the common group of the memory cells to a second parity group, different from the first parity group.

There is additionally provided, in accordance with an embodiment that is described herein, a method for data storage, including, in a storage device, which includes a Nonvolatile Memory (NVM) including multiple memory cells, the memory cells are organized in multiple memory blocks, and each memory block includes multiple Word Lines (WLs) of the memory cells, assigning in a recovery scheme data pages to multiple predefined parity groups, including assigning to a parity group multiple data pages of two or more different bit-significance values in a common group of the memory cells belonging to a given WL. Redundancy data is calculated over the data pages of a given parity group in accordance with the recovery scheme, and the calculated redundancy data is stored in a dedicated group of the memory cells. A selected data page that belongs to the given parity group is read, and upon detecting a failure in reading the selected data page, the given parity group is identified in accordance with the recovery scheme, and the selected data page is recovered based on other data pages belonging to the given parity group and on the redundancy data calculated for the given parity group.

There is additionally provided, in accordance with an embodiment that is described herein, a memory controller, including an interface and a processor. The interface is configured to communicate with a Nonvolatile Memory (NVM) including multiple memory cells. The memory cells are organized in multiple memory blocks, and each memory block includes multiple Word Lines (WLs) of the memory cells. The processor is configured to assign in a recovery scheme, data pages to multiple predefined parity groups, including assigning to a parity group multiple data pages of two or more different bit-significance values in a common group of the memory cells belonging to a given WL. The processor is further configured to calculate redundancy data over the data pages of a given parity group in accordance with the recovery scheme, to store the calculated redundancy data in a dedicated group of the memory cells, via the interface. The processor is configured to read, via the interface, a selected data page that belongs to the given parity group, and upon detecting a failure in reading the selected data page, to identify the given parity group in accordance with the recovery scheme, and recover the selected data page based on other data pages belonging to the given parity group and on the redundancy data calculated for the given parity group.

These and other embodiments will be more fully understood from the following detailed description of the embodiments thereof, taken together with the drawings in which:

DETAILED DESCRIPTION OF EMBODIMENTS

Overview

Figure 1:
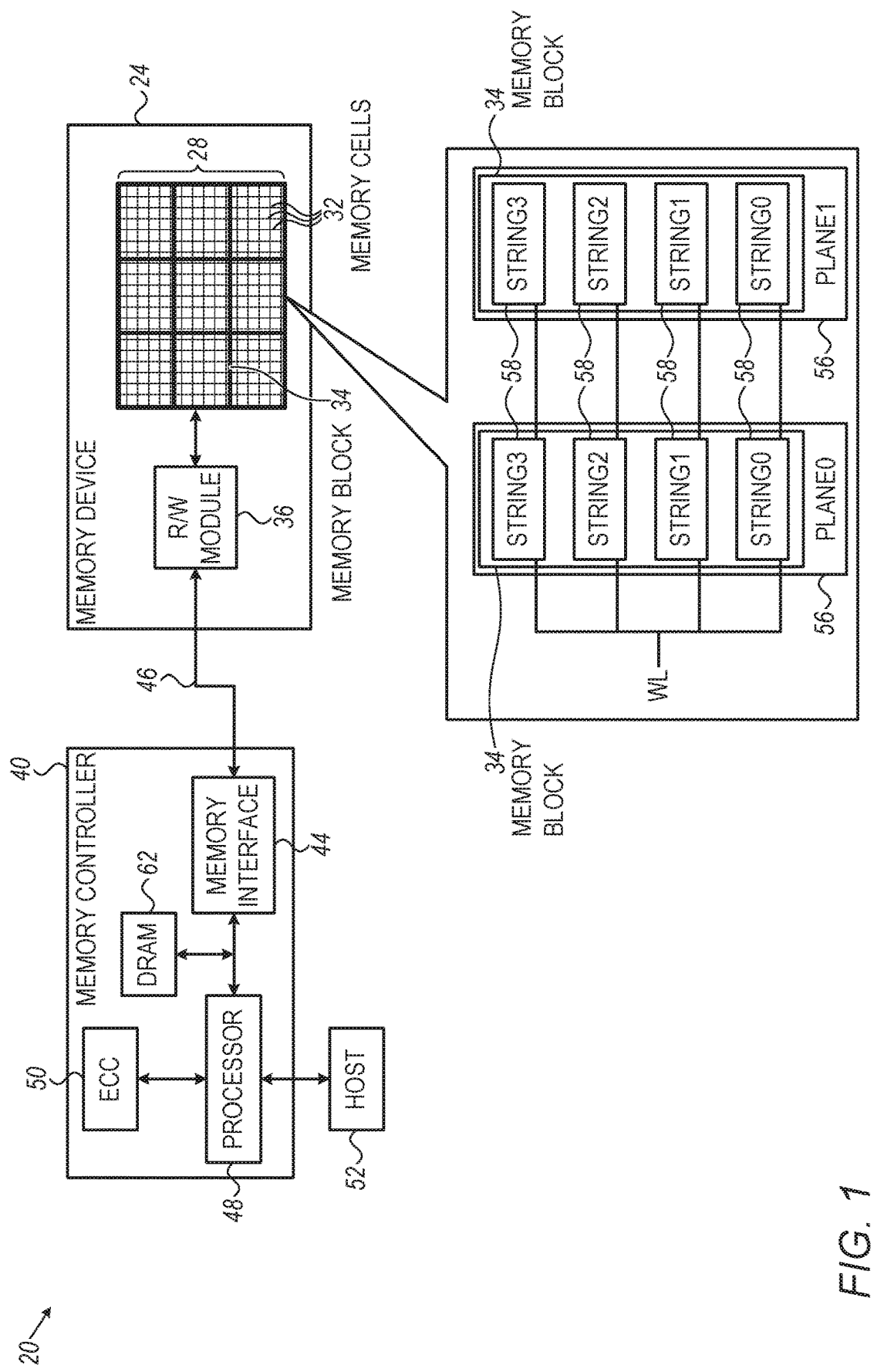
FIG. 1 is a block diagram that schematically illustrates a memory system, in accordance with an embodiment that is described herein.

In various storage systems, data is protected while being programmed and during storage periods. Methods for recovering lost data typically require extra storage space, e.g., for storing a copy of the data or redundancy data.

The embodiments described herein provide systems and methods for full block data recovery in a Nonvolatile Memory (NVM) using small footprint storage area.

The amount of extra storage required for redundancy data typically depends on the storage density and on the data recovery scheme employed. For example, a Redundant Array of Inexpensive Disks (RAID) scheme that calculates full block redundancy data over multiple memory blocks of user data, may support recovering one or more failing Word Line (WL) in a memory block, and up to the entire memory block. A RAID scheme of this sort may similarly be used at a die level, e.g., protecting multiple dies with redundancy data stored in another die. Such schemes may require large storage space for the redundancy data and are typically inapplicable in small-size storage systems.

Low density storage systems typically support full block protection during programming. For storage periods, however, a modest recovery scheme such as, for example, a scheme that protects only one or two WLs in a memory block may be used. In such storage systems, temporary redundancy data calculated during the programming of a memory block may be stored in an auxiliary memory such as a Dynamic Random Access Memory (DRAM). Using DRAM is advantageous because it provides fast access, no write endurance degradation and low power consumption, compared to NVM.

The storage area required for redundancy data typically increases with the size of the memory block specified. Trends in advanced storage technology indicate that the memory block size may increase in order to reduce the capacitance charge/discharge time-constant of the circuit (also denoted RC time-constant of a resistor-capacitor circuit) and to optimize the die size. The RC value is typically indicative of the circuit speed and is related to the power dissipation. Techniques used by vendors for increasing the block size, include, for example, vertical scaling—increasing the number of insulating layers within a memory block, and lateral compaction—reducing the physical dimensions of the circuit elements, such as reducing the width and space occupied by word lines and bit lines within the memory array. Moreover, modern memory devices may suffer increased failure rates due to the increased block size, and due to technology scaling with reduced manufacturing quality. Specifically, in advanced technology memory devices, defects may cause data loss in multiple worlds lines and bit lines of a memory block, up to a failure of a full block.

Since the density of DRAM devices is not expected to increase as fast as the block size in NVM devices, the cost of storing full block redundancy data in DRAM may become too high for a large block size. Moreover, using a large block size may be problematic in storing redundancy data for protecting data during storage periods, e.g., in a single-die system.

In a multi-bit per cell device, multiple data pages of different bit-significance values may be stored in a common group of the memory cells in a WL. For example, a 3 bit/cell device supports storing a Least Significant Bit (LSB) data page, a Most Significant Bit (MSB) data page and an Upper-Significant Bit (USB) data page, in a common group of memory cells. The bit-significance value is also referred to herein as a "page type." Data stored in a nonvolatile memory may be lost for various reasons, such as due to manufacturing defects that result in shorts among WLs and/or leakage from a WL to substrate. In such failure modes, multiple data pages in a WL storing data pages of different bit-significance values are lost concurrently.

Several recovery schemes that will be described below are designed to protect against failures in only one of the bit-significance values. A failure mode of this sort may be caused, for example, by the "erase penetration" impairment, in which erased memory cells are shifted to higher values and may be falsely interpreted as programmed to a programming level other than the erasure level. The erase penetration impairment causes read failure mainly in LSB data. Another example of this failure mode may occur in a WL having a high resistance, e.g., due to lack of metallic material (poor conductivity), bad WL contact and/or a point defect, for example. Sensing for reading the memory cells in a WL having high resistance may result in a large number of errors because the increased resistance increases the sensing delay, e.g., due to the increased RC time-constant. This failure mode typically occurs in only one of the multiple page types (e.g., LSB, MSB or USB), because the timing and signal strength varies among the different read threshold configurations used in reading the different page types. For example, in a high-resistance WL, reading the middle (MSB) data page using three read thresholds may result in a larger number of errors compared to reading the LSB and USB data pages using only two read thresholds.

In some embodiments, a memory controller communicates with a Nonvolatile Memory (NVM) comprising multiple memory cells, wherein the memory cells are organized in multiple memory blocks, and each memory block comprises multiple Word Lines (WLs) of the memory cells. The memory controller assigns in a recovery scheme data pages to multiple predefined parity groups, including assigning to a parity group multiple data pages of two or more different bit-significance values in a common group of the memory cells belonging to a given WL. For example, in a 3 bit/cell device, LSB, MSB and USB data pages in the same group of memory cells are assigned to the same parity group. The memory controller calculates redundancy data over the data pages of a given parity group in accordance with the recovery scheme and stores the calculated redundancy data in a dedicated group of the memory cells. In an embodiment, the memory controller calculates and stores separate redundancy data for each of the predefined parity groups. The memory controller may calculate the redundancy data, e.g., by applying a bitwise XOR operation among the data pages of the parity group.

At a later time, the memory controller reads a selected data page that belongs to the given parity group, e.g., on demand. Upon detecting a failure in reading the selected data page, the memory controller identifies the given parity group in accordance with the recovery scheme, and recovers the selected data page based on other data pages belonging to the given parity group and on the redundancy data calculated for the parity group.

In some embodiments, the memory controller calculates the redundancy data over at least a first data page having a first bit-significance value and a second data page having a second different bit-significance value, wherein both the first data page and the second data page are stored in a common group of the memory cells.

The recovery scheme may be extended by assigning to a parity group multiple data pages respectively belonging to multiple different groups of the memory cells. These different groups are selected so that data pages stored in different groups of the memory cells are expected not to fail concurrently, with high probability. This requirement may be fulfilled, for example, by selecting groups of the memory cells that belong to a same WL across multiple planes of the memory blocks. In other embodiments, the memory cells are organized in a Three-Dimensional (3D) configuration in which each memory block comprises multiple strings, and the groups of the memory cells belong to a same WL across multiple respective strings of a same memory block.

In the techniques disclosed above, under the assumption that multiple data pages in a common group of memory cells, and having different bit-significance values do not fail concurrently, an efficient recovery scheme that assigns these multiple data pages to the same parity group is constructed. This approach significantly reduces the amount of redundancy data required. For example, in a device that stores 3 bits/cell, the amount of redundancy data reduces by a ratio of 1:3, compared to methods in which only one of these data pages is assigned to the parity group.

In some embodiments, the memory controller initially programs data to memory blocks in a single bit per cell mode for fast and reliable programming. Memory blocks that store a single bit per memory cell are also referred to as Single-Level Cell (SLC) Blocks. At a later time, the memory controller copies the data from the SLC blocks to target memory blocks in multi-bit per cell mode. For example, target memory blocks that store three bits per memory cell are also referred to as Triple-Level Cell (TLC) blocks.

Consider a reference scheme, in which the memory controller protects the data in the SLC blocks by calculating redundancy data up to a full SLC block. As noted above, such a reference scheme may be inapplicable when storing the redundancy data in a DRAM.

In some embodiments, the memory controller protects only part (e.g., half or a quarter) of the data stored in the SLC block at any given time. For example, the memory controller programs and protects up to a first half of the SLC block and copies the first half to target memory blocks before programming the second half of the SLC block. The first half corresponds, for example, to half the number of WLs in the SLC block, wherein the WLs are distributed among the two halves of the memory block in any suitable way. Note that after copying the first half to the target memory blocks, the storage space used for redundancy data in protecting the first half is no longer needed and is freed for protecting the other half of the SLC block. Moreover, at this stage the SLC block is not erased. When completing the programming the other half, the memory controller copies the other half to a target memory block and erases the SLC block. The programming process in the above embodiment requires only a portion (e.g., half) of the block size for redundancy data and does not increase the wear level of the memory cells of the SLC blocks, because block erasure is applied at the same rate as in the above reference scheme. In the present context, the term "wear level" refers to a performance, quality or reliability degradation occurring in memory cells due to applying to these memory cells a large number of program and erase (P/E) cycles.

In some embodiments, the memory controller applies another programming process that reduces the average amount of redundancy data required per memory block, e.g., in the DRAM, compared to a reference scheme, in which block-level redundancy data is calculated over a stripe of multiple SLC blocks, wherein the SLC blocks reside in multiple respective different planes. In some embodiments, to reduce the average amount of the redundancy data, the memory controller calculates redundancy data over multiple SLC blocks, wherein at least two of the SLC blocks reside in the same plane. For example, in a two-plane device, the memory controller may calculate redundancy data over four SLC blocks, wherein each of the planes contains two of these SLC blocks. In this example, the average amount of redundancy data is reduced by half, compared to the reference scheme that uses conventional stripes.

In the disclosed techniques, novel schemes are used for data protection, while balancing between the protection level and the required storage footprint. As a result, the power consumption and cost are reduced, and the performance improves.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved. In the present context and in the claims, the term "memory system" is also referred to as a "storage device."

Memory system 20 comprises a Non-Volatile Memory (NVM) device 24, which stores data in a memory array 28 that comprises multiple memory cells 32, such as analog memory cells. The memory cells are arranged in multiple memory blocks 34. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values. In the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell device and a 4 bit/cell device, also referred to as a Triple-Level Cell (TLC) and Quad-Level Cell (QLC), can be programmed to assume one of eight and one of sixteen possible programming levels, respectively. A memory cell that stores a single bit (i.e., using two programming levels) is also referred to as a Single-Level Cell (SLC). Note that a memory cell capable of storing multiple bits, e.g., a TLC, may be programmed in SLC mode for storing a single bit.

Memory device 24 comprises a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the memory cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. In some embodiments, the R/W module supports setting read thresholds only within a predefined range of voltages.

Memory system 20 comprises a memory controller 40 that performs storage and retrieval of data in and out of memory device 24. Memory controller 40 comprises a memory interface 44 for communicating with memory device 24, a processor 48, and an error correction code (ECC) module 50. Memory controller 40 communicates with memory device 24 via memory interface 44 over a communication link 46. Communication ink 46 may comprise any suitable link or communication bus, such as, for example, a PCIe bus.

In some embodiments, memory controller 40 communicates with memory device 24 storage commands such as erase, program and read command. Memory controller 40 may communicate with memory device 24 control commands, e.g., for configuring read thresholds. The disclosed techniques can be carried out by memory controller 40, by R/W module 36, or both. Thus, in the present context, memory controller 40 and R/W module 36 are referred to collectively as "storage circuitry" that carries out the disclosed techniques.

Memory controller 40 communicates with a host 52, for accepting data for storage in memory device 24 and for outputting data retrieved from memory device 24. In some embodiments, ECC module 50 encodes the data for storage using a suitable ECC and decodes the ECC of data retrieved from the memory. ECC module 50 may comprise any suitable type of ECC, such as, for example, Low Density Parity Check (LDPC), Reed-Solomon (RS) or Bose-Chaudhuri-Hocquenghem (BCH), can be used. The word produced by the ECC encoder in a single encoding operation, in accordance with the rules defining the underlying code, is also referred to as a code word (CW).

Data read from a group of memory cells may contain one or more errors. The number of errors typically increases when the read threshold used for sensing the memory cells is positioned non-optimally. A read operation fails, for example, when the number of errors in the read data exceeds the ECC capabilities.

Memory controller 40 may be implemented in hardware, e.g., using one or more Application-Specific Integrated Circuits (ASICs) or Field-Programmable Gate Arrays (FPGAs). Alternatively, memory controller 40 may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device 24, in alternative embodiments memory controller 40 may control multiple memory devices 24. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, memory device 24 and memory controller 40 may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor such as processor 48 or another element of the host system. In some embodiments, host 52 and memory controller 40 may be fabricated on the same die, or on separate dies in the same device package.

In some embodiments, processor 48 of memory controller comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple memory pages, i.e., groups of memory cells that are programmed and read simultaneously. In a multi-bit per cell mode, a group of memory cells may store multiple data pages of multiple different respective bit-significance values.

In some embodiments, a given memory die comprises multiple memory arrays that are referred to as planes 56, and it is possible to program multiple pages into multiple respective planes in parallel. Typically, failing word lines can cause failure to word lines within the planes of a given die, but not with the planes of other dies.

In the example of FIG. 1, the memory cells are arranged in a Three-Dimensional (3D) configuration. In such embodiments, the memory cells are arranged in multiple strings 58, wherein each WL comprises memory cells of multiple different strings. In the example of FIG. 1, a WL connects to four strings 58 of a 3D memory block 34 in each of planes 56 denoted PLANE0 and PLANE1. For the sake of clarity, FIG. 1 depicts only one memory block in each plane. In practice, however, each plane comprises multiple memory blocks.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, memory device 24 is provided with a respective physical address.

Erasing of the memory cells in memory array 28 is usually carried out in blocks that contain multiple memory pages. Typical memory devices (such as memory device 24) may comprise thousands of erasure blocks, also referred to as "memory blocks" 34. In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit-significance value would have 256 data pages per erasure block, and three-bit per-cell devices would have 384 data pages per block. A typical Three-Dimensional (3D) device that stores three bits per cell may comprise, for example, 4 strings per block, wherein each string comprises several thousand layered columns that each comprises 48 layers of cell columns. Such a 3D device has 12 data pages per a physical word line, or 576 data pages per an erasure block. Alternatively, other block sizes and configurations can also be used.

In some embodiments, memory controller 40 calculates redundancy data for recovering data stored in a memory block 34, wherein the stored data has been corrupted due to a subsequent programming operation in this memory block 34. In an embodiment, memory controller 40 stores the redundancy data in an auxiliary memory 62 that may comprise any suitable memory such as a Dynamic Random Access Memory (DRAM) 62. In another embodiment, memory controller 40 stores the redundancy data in one or more memory blocks 34 of memory device 24.

In some embodiments, memory controller 40 first programs data to one or more memory blocks 34 in SLC mode. When a memory block programmed in SLC mode becomes fully programmed, memory controller 40 copies the data stored in a memory block in SLC mode to another memory block using multi-bit per cell programming e.g., in TLC mode. After memory controller 40 verifies that the data is successfully programmed in TLC mode, memory controller 40 may discard the redundancy data associated with programming that memory block. In some embodiments, as will be described in detail below, memory controller 40 may discard redundancy data after programming only part of memory block 34 in SLC mode, which reduces the required size of auxiliary memory 62.

In some embodiments, memory controller 40 protects data written in TLC mode using various data recovery schemes, which are based on assigning to a common parity group multiple data pages having multiple different bit-significance values, wherein the multiple data pages are stored in a group of memory cells of a WL. The physical organization of the redundancy data written to memory device 24 is optimized for high performance and protection, e.g., by distributing the redundancy data among multiple physical dies and/or planes.

Some of the embodiments that will be described below are based on the assumption that for multiple data pages of multiple different bit-significance values stored in a common group of memory cells, a read failure may occur in only one of the bit-significance values, concurrently. An example impairment that may cause a read failure in only one bit-significance value in referred to as an "erase penetration." In erase penetration, threshold voltages of erased memory cells are shifted to higher values and may be falsely interpreted as programmed to a programming level other than the erasure level. As a result, a read failure may occur in reading LSB data pages at a much higher rate than in reading higher bit-significance data pages. The erase penetration impairment may cause read failures in multiple consecutive WLs, possibly in a common plane or string. In the erase penetration impairment, a defect in one of the WLs may cause a voltage drop and therefore incomplete erasure of the memory cells in this WL. This effect is sometimes referred to as a WL-to-Metal Hole short, or "WL-MH." In a NAND type memory, an erase verify operation is performed to the memory cells of the entire memory block (34) in parallel, and therefore incomplete erasure in a single WL may not be detected. As a result, reading the LSB data page from this WL may result in excessive number of errors, e.g., beyond the error correction capabilities of the ECC used.

Another impairment causing a read failure in one of the bit-significance values is the high-resistance WL mentioned above. A high-resistance WL may be caused, for example, due to WL thinning, large metal holes and/or bad WL contact. In a WL having a high resistance, lack of metallic material increases the RC delay in sensing the memory cells. Since the WL is partially conductive, and not sensed as an open circuit, such an impairment is typically hard to detect.

In some embodiments, memory controller 40 applies a data recovery method for protecting data stored in memory device 24. The recovery method comprises a redundancy calculation phase and a data recovery phase. In implementing the redundancy calculation phase, memory controller 40 assigns to each parity group among multiple predefined parity groups, data pages that are unlikely to fail concurrently. Memory controller 40 calculates redundancy data over the data pages of each parity group and stores the redundancy data in memory device 24. When reading a data page fails, memory controller 40 may recover the lost data page using the remaining data pages in the parity group to which the failing data page belongs, and the redundancy data calculated for that parity group.

Memory controller 40 may assign data pages to parity groups in various ways. For example, for assigning to a parity group data pages that typically do not fail concurrently, the data pages may belong to different physical groups of memory cells such as in different memory blocks, planes, strings and/or dies. In some embodiments, it is assumed that when reading a data page of a given bit-significance value, other data pages stored in the same group of memory cells as the failing data page, and having other bit-significance values, would be read successfully. For example, in the erase penetration impairment, failures in reading LSB data are much more likely to occur than in data pages of other bit-significance values. As will be described below, this assumption allows using a small footprint memory for storing redundancy data.

Figure 2:
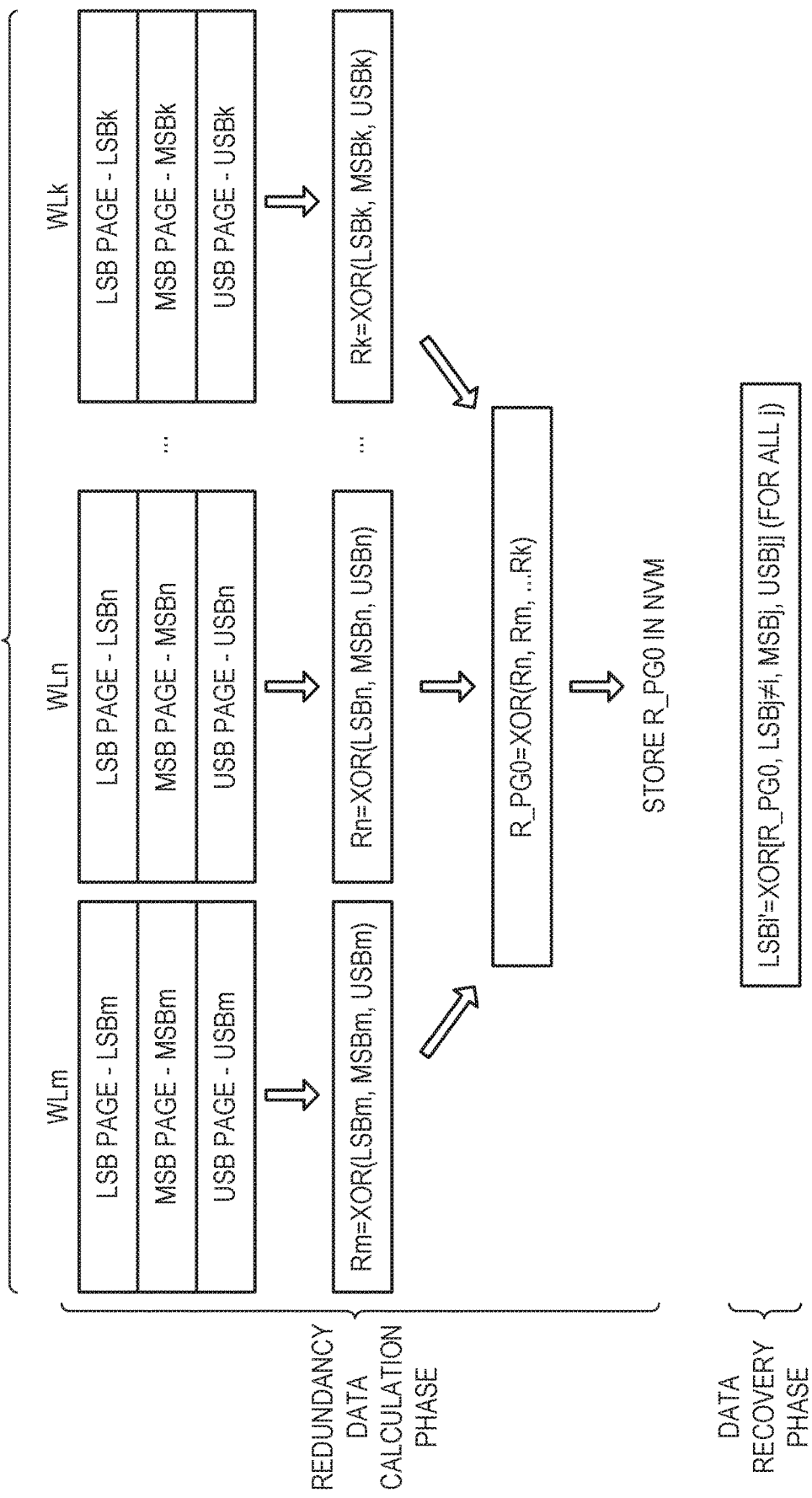
FIG. 2 is a diagram that schematically illustrates a data recovery scheme in which multiple data pages in a common WL having different bit-significance values are assigned to the same parity group, in accordance with an embodiment that is described herein.

FIG. 2 is a diagram that schematically illustrates a data recovery scheme in which multiple data pages in a common WL having different bit-significance values are assigned to the same parity group, in accordance with an embodiment that is described herein. The recovery scheme comprises a redundancy calculation phase and a recovery phase. The recovery scheme of FIG. 2 may be applied, for example, by memory controller 40 of FIG. 1.

The example of FIG. 2 refers to a TLC device that stores LSB, MSB, and USB data pages in a group of memory cells belonging to a common WL. This is a non-limiting example, and in other embodiments, memory devices (24) that store a number of bits per cell other than three can also be used.

In the context of the present application and in the claims "a memory cell belonging to a WL" refers to a memory cell that is connected to that WL and may receive pulses and/or voltages via the WL during programming, erasure and read operations.

In FIG. 2, multiple word lines denoted WLm, WLn, ..., WLk store multiple data pages that memory controller 40 assigns to a common parity group denoted PG0. The WL index refers to the WL number within the parity group. The number of data pages in a parity group depends on the underlying storage configuration and on the protection scheme used. For example, a parity group may protect a failure in a data page of one bit-significance value, in a single WL in a single plane. In this case the bitwise XOR operation may be carried out over data pages of multiple different bit-significance values in each WL, across planes and dies used in the system. In a scheme that protects against a read failure in a single bit-significance value, in one or two WLs per block, bitwise XOR is applied to data pages of multiple different bit-significance values across different WLs in the same memory block.

In general, WLs storing data pages that belong to the same parity group may belong to the same or different memory blocks 34, in the same or different planes and/or dies. The LSB, MSB and USB data pages stored in the $j^{th}$ word line WLj are denoted LSBj, MSBj and USBj. In the present context, a data page that participates in calculating redundancy data for a parity group is referred to as herein as "a data page belonging to the parity group."

In the example of FIG. 2, the recovery scheme is implemented using bitwise XOR operations. To calculate the redundancy data for parity group PG0, memory controller 40 calculates the redundancy data over multiple data pages of different bit-significance values in each of the WLs– WLm, WLn, ..., WLk. Specifically, memory controller 40 calculates multiple redundancy results Rj=XOR(LSBj, MSBj, USBj) for j=m, n, ..., k. Memory controller 40 calculates the redundancy data R_PG0 for parity group PG0 by calculating R_PG0=XOR(Rm, Rn, ..., Rk). Memory controller 40 stores R_PG0 in memory device 24 to be used later for data recovery.

The order of applying XOR operations in FIG. 2 is given by way of example, and in other embodiments, any other suitable order of XORing among the data pages can also be used. For example, the memory may first bitwise XOR among data pages of each bit-significance value across multiple WLs, and then bitwise XOR among the three results corresponding to the three bit-significance values.

To recover a data page failing in the parity group, memory controller 40 may read each of the other data pages in the parity group and further read the redundancy data stored for that parity group. Memory controller 40 recovers the lost data page, e.g., by calculating a bitwise XOR operation among the other data pages and the redundancy data.

For example, consider a read failure occurring in reading a data page denoted LSBi, and assume that the remaining data pages in PG0, as well as R_PG0 are readable successfully. Memory controller 40 reads R_PG0 and data pages LSBj≠i, MSBj, USBj for all j in the parity group, and recovers the lost data page by calculating LSBi'=XOR (R_PG0, LSBj≠i, MSBj, USBj) for all j.

In the redundancy scheme of FIG. 2, LSB, MSB and USB data pages stored in a common group of memory cells are assigned to the same parity group (PG0). This reduces the storage size required for redundancy by a factor of three, compared to a scheme in which data pages of different bit-significance values that are stored in a common group of memory cells are assigned to different parity groups.

The recovery scheme of step 100 may include assignments of multiple data pages belonging to multiple different groups of memory cells, to the same parity group. These groups of memory cells may be selected in any suitable way. In one embodiment, these groups of the memory cells may belong to the same WL across multiple planes of the memory blocks, e.g., in one or more dies. In another embodiment, memory device 24 comprises a Three-Dimensional (3D) configuration, and the multiple groups of the memory cells belong to the same WL across multiple respective strings of a same memory block 34.

Figure 3:
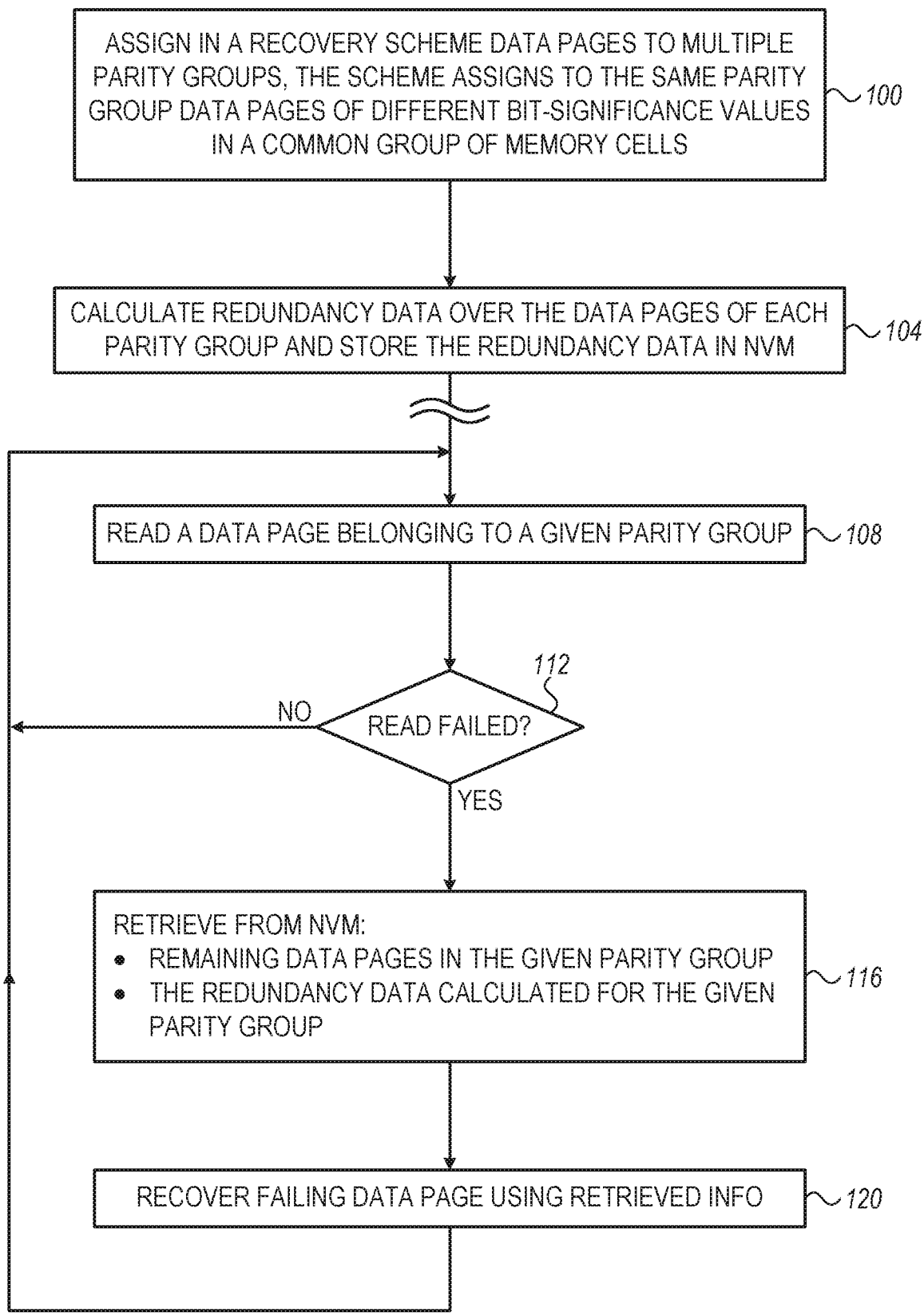
FIG. 3 is a flow chart that schematically illustrates a method for data recovery using small footprint storage area for redundancy data, in accordance with an embodiment that is described herein.

FIG. 3 is a flow chart that schematically illustrates a method for data recovery using small footprint storage area for redundancy data, in accordance with an embodiment that is described herein. The method will be described as executed by memory controller 40.

The method begins with memory controller 40 assigning in a recovery scheme data pages to multiple predefined parity groups, at a recovery scheme definition step 100. In an embodiment, memory controller 40 defines the recovery scheme as a set of predefined rules that assign data pages to the parity groups.

In some embodiments, memory controller 40 assigns (in the recovery scheme) multiple data pages of different bit-significance values that are stored in a common group of memory cells (e.g., in a given WL) to the same parity group. For example, in a TLC device, at least two of the LSB, MSB and MSB data pages stored in the same group of memory cells are assigned to the same parity group. As another example, in a QLC device, four data pages in a common group of memory cells and having four different bit-significance values are all assigned to the same parity group, or assigned in pairs to two different parity groups, for example. By assigning four data pages in pairs to two different parity groups, two data pages having respective different bit-significance values in the common group of the memory cells, can be recovered simultaneously, assuming these two data pages are respectively protected by the different parity groups.

In an example embodiment, memory device 24 supports storing in each WL four or more data pages of four or more different respective bit-significance values. In such embodiments, memory controller 40 assigns two data pages having first and second bit-significance values in the common group of the memory cells to a first parity group, and assigns a second pair of data pages having third and fourth bit-significance values in the common group of the memory cells to a second parity group different from the first parity group.

At a redundancy calculation step 104, memory controller 40 calculates redundancy data for each of the parity groups in accordance with the recovery scheme. For example, memory controller 40 calculates a bitwise XOR operation over the data pages assigned to the parity group to produce the redundancy data for that parity group. Memory controller 40 stores the redundancy data calculated for each parity group, in a dedicated group of memory cells of memory device 24.

At a reading step 108, memory controller 40 reads a data page from memory device 24. The data page belongs to a given parity group in accordance with the recovery scheme of step 100. At a failure checking step 112, memory controller 40 checks whether reading the data page has failed, and if not, loops back to step 108 to read a subsequent data page.

Memory controller 40 may detect a read failure in various ways. In some embodiments, memory controller 40 receives a read failure indication from memory device 24. Alternatively of additionally, memory controller 40 stores the data pages encoded, e.g., using ECC module 50. In such embodiments, memory controller 40 decodes the ECC of a data page read, and identifies a read failure when the data page read comprises a number of errors beyond the decoding capabilities of the ECC.

When at step 112 memory controller 40 detects a read failure, memory controller 40 proceeds to a retrieval step 116. At step 116, memory controller 40 identifies the given parity group in accordance with the recovery scheme, and retrieves from memory device 24 (i) the remaining data pages that were assigned to the same parity group as the failing data page, and (ii) the redundancy data calculated for the given parity group. At a recovery step 120, memory controller 40 uses the information retrieved at step 116 to recover the failing data page. For example, memory controller 40 applies a bitwise XOR operation among the remaining data pages and the redundancy data of the given parity group.

Following step 120, memory controller 40 loops back to step 108 to read a subsequent data page.

Schemes for Recovering Data Lost During Programming

The memory cells in storage systems such as memory system 20 may be organized in various configurations, depending, for example, on the overall storage capacity of the underlying storage system. For example, the memory cells of memory device 24 may belong to one or more separate dies, wherein each die comprises one or more planes, and each plane comprises multiple memory blocks 34.

Memory controller 40 typically programs data to memory device 24 in units of a data page. As a result, multiple programming operations are required for programming all the WLs of a single memory block 34. During programming, data already programmed to a memory block 34 may be lost for various reasons. For example, a programming operation involves applying high voltage levels to the memory cells being programmed in a given WL, which may result in corrupting data that has been previously programmed to other WLs in the same memory block, or to the same WL in other planes. A nonvolatile memory in a Three-Dimensional (3D) configuration is prone to manufacturing defects, such as a WL to Common Source Line (CSL) short or leakage, which may result in losing an entire 3D memory block. To prevent data loss during programming, information for recovering the data being programmed should be retained until verifying that the data has been programmed successfully.

In some embodiments, memory controller 40 allocates multiple memory blocks 34 in a die to operate in a SLC mode. A memory block 34 storing data in SLC mode is also referred to as a "SLC block." The multiple SLC blocks are collectively referred to as a "SLC buffer," which serves, for example, as a fast input buffer for receiving data from memory controller 40. At a later selected time, memory controller 40 copies the data from the SLC buffer to target memory blocks 34 operating in a multi-bit per cell mode, such as MLC or TLC mode, for example. A memory block 34 storing data in TLC mode is also referred to herein as a "TLC block."

In some embodiments, memory controller 40 supports recovering corrupted data in the SLC buffer until verifying the content of one or more fully programmed SLC blocks, in which case memory controller 40 copies the verified content from the SLC blocks to target memory blocks 34 in a multi-bit per cell mode, e.g., TLC blocks.

The data being programmed to one or more SLC blocks may be protected using a block-level RAID scheme. Consider a reference scheme, in which memory controller 40 calculates redundancy data for multiple SLC blocks by applying a bitwise XOR operation across the multiple SLC blocks. The redundancy data in this scheme requires a storage space of a full SLC block. When the data in one of the SLC blocks gets corrupted, the lost data can be recovered using the remaining SLC blocks and the redundancy data in the additional SLC block.

In this reference scheme, the larger the block size, the larger the storage space required for the redundancy data. The size of the memory block (34) may be defined, for example, in terms of its storage capacity, the number of memory cells, the number of WLs and the like.

In some embodiments, memory controller 40 stores the redundancy data for protecting SLC blocks being programmed in DRAM 62. Since typically the storage capacity of the DRAM is relatively small, the DRAM storage space may be insufficient for storing redundancy data in cases of a large block size. Embodiments that support full block protection during programming with reduced size redundancy data are now described. Note that the DRAM typically serves all (or a large number of) system operations, leaving only a small portion of the DRAM storage space for redundancy data. Small footprint redundancy data is important also in embodiments in which the redundancy data is stored in memory device 24 (and not in an auxiliary memory such as a DRAM). This is because storing large amounts of redundancy data reduces the effective storage space left available for user data, increases the wear out level of the memory cells, and slows down the speed of writing to memory device 24, because the overall number (and rate) of writing operations increases.

Figure 4:
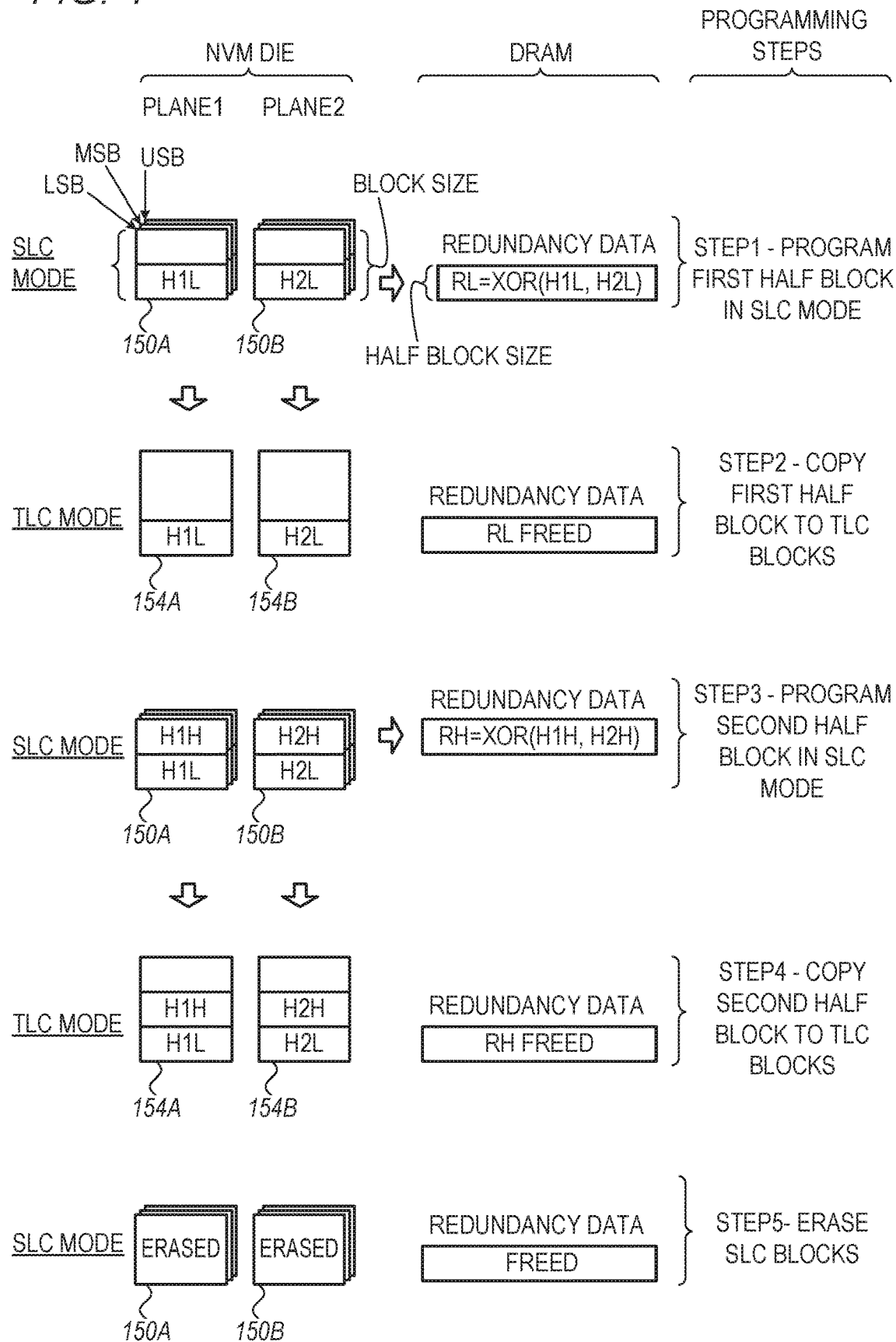
FIG. 4 is a diagram that schematically illustrates a programming scheme, including protecting data being programmed to memory blocks using small footprint storage space, in accordance with an embodiment that is described herein.

FIG. 4 is a diagram that schematically illustrates a programming scheme, including protecting data being programmed to memory blocks 34 using small footprint storage space, in accordance with an embodiment that is described herein. The programming scheme will be described as executed by memory controller 40.

The example diagram in FIG. 4 refers to a TLC device comprising a die having two planes of memory blocks denoted PLANE1 and PLANE2. Memory controller 40 protects content stored in SLC blocks during programming, by storing redundancy data in a suitable storage space, e.g., in DRAM 62.

In the example of FIG. 4, memory blocks 150A and 154A belong to PLANE1 and memory blocks 150B and 154B belong to PLANE2 of the same die. Memory blocks 150A and 150B comprise SLC blocks, whereas memory blocks 154A and 154B are target TLC blocks. In the present example, memory controller 40 programs LSB data, MSB data and USB data to separate SLC blocks 150. Memory blocks 150 and 154 may implement memory blocks 34 of memory device 24 in FIG. 1.

Unlike the reference scheme described above, in the programming scheme of FIG. 4, memory controller 40 programs portions of SLC blocks 150A and 150B and copies the portions separately to the target memory blocks 154A and 154B. In FIG. 4 the size of each portion is half the block size.

The programming process in FIG. 4 is now described as a sequence of steps denoted STEP1 . . . STEP5. At the beginning of the process, SLC blocks 150 are assumed to be erased.

At a first programming step—STEP1, memory controller 40 programs SLC blocks 150A and 150B up to half the block size. For example, memory controller 40 programs up to half of the WLs in the SLC blocks. In FIG. 4, the content representing half of the block size is denoted H1L in SLC blocks 150A and H2L in SLC blocks 150B, in the respective planes PLANE1 and PLANE2.

Further at STEP1, memory controller 40 calculates redundancy data RL for recovering one of H1L and H2L and stores RL in the DRAM. In some embodiments, memory controller 40 calculates the redundancy data using a bitwise XOR operation given by RL=XOR(H1L, H2L). Note that the redundancy data RL occupies only half the block size (in each of the bit-significance values) compared to the reference scheme. Memory controller 40 typically executes STEP1 by programming the SLC blocks one WL at a time, and proceeds to STEP2 when half of the WLs in each of the SLC blocks become programmed.

At a first copy step STEP2, memory controller 40 copies the halves H1L and H2L to respective TLC blocks 154A and 154B. In some embodiments, memory controller 40 reads back the LSB, MSB and USB data in each of H1L and H2L, verifies that the read data is uncorrupted, and programs the read data to the target memory blocks in TLC mode. After programming H1L and H2L to the target memory blocks, the corresponding redundancy data RL is no longer needed, and the storage space in the DRAM used for storing RL is freed. Note that at this stage memory controller 40 does not erase the SLC blocks.

The subsequent steps—second programming step STEP3 and second copy step STEP4, are similar to respective steps STEP1 and STEP2 describe above but are applied to the other halves of the SLC blocks.

At STEP 3, memory controller 40 programs the halves denoted H1H and H2H of the SLC blocks. Since the SLC blocks we not erased, H1L and H2L are still programmed to the SLC blocks. In programming H1H and H2H, memory controller 40 calculates redundancy data RH=XOR(H1H, H2H) and stores RH in the DRAM. Again, RH occupies only half the block size (in each of the bit-significance values) compared to the reference scheme. Memory controller 40 may program the redundancy data RH, for example, in place of the storage space that was used at STEP1 for storing RL and was freed and was STEP2.

At STEP4, when the other halves of the SLC blocks become fully programmed, memory controller 40 copies H1H and H2H to the target TLC blocks. After programming H1H and H2H to the target memory blocks, the corresponding redundancy data RH is no longer needed, and the storage space in the DRAM used for storing RH is freed.

At this stage, the entire data programmed to the SLC block is verified and copied to the target TLC blocks, and memory controller 40 proceeds to STEP5 to erases SLC blocks 150. Memory controller 40 may use the erased SLC blocks in a executing a subsequent programming cycle over STEP1 . . . STEP5.

Using the programming scheme of FIG. 4, the storage space required for storing redundancy data for protecting the full SLC block is only half the block size in the naïve reference scheme. Moreover, memory controller 40 erases the SLC block only after the entire SLC block is programmed, and therefore the number of P/E cycles applied to the SLC blocks is the same as in the reference scheme, assuming programming the same amount of data in both schemes. Therefore, the method of FIG. 4 does not increase the wear level of the SLC blocks.

Note that when using the programming scheme of FIG. 4, memory controller 40 may be required to copy data from the SLC blocks to the target TLC blocks at a relatively high rate, e.g., for supporting long sequences of programming operations to memory device 24. Failing to do so may result in underutilized SLC blocks. Moreover, slow eviction of data portions (e.g., halves) from SLC blocks to the TLC blocks may result in degraded user experience. One way to avoid such degradation is to increase the number of memory blocks allocated as SLC blocks. Since memory controller 40 needs to evict half-programmed SLC blocks to target TLC blocks, before the other halves may be programmed, the burst duration, which is a period of fast SLC programming, is cut in half. The overall burst duration increases with the number of SLC blocks allocated. In some embodiments, at least some memory blocks may operate, at different times, in either SLC or TLC mode. when memory device 24 is relatively empty, memory controller 40 may assign a large number of the memory blocks to operate temporarily in SLC mode, thus achieving a longer burst duration.

The programming scheme of FIG. 4 may be implemented in various variant schemes. For example, the programming scheme is applicable in a similar manner in memory devices other than TLC devices. In another variant programming scheme, portions of the SLC block other than halves of the block size, e.g., quarters of the block size may be used. Moreover, portions of the SLC block of different sizes may also be used.

In the method of FIG. 4, memory controller 40 calculates redundancy data over a number of WLs smaller than the entire number of WLs in the memory blocks to reduce the amount of DRAM space required for storing the redundancy data. A different approach for reducing the required storage space for the redundancy data is now described.

Consider a memory device 24 in which the memory cells are organized in two or more planes. In conventional RAID schemes, memory controller 40 calculates block-level redundancy data over a stripe of multiple SLC blocks, wherein each of these SLC blocks resides in a different plane. For example, in a two-plane device, one SLC block for storing redundancy data is required for protecting two SLC blocks during programming.

In some embodiments, memory controller 40 calculates redundancy data over multiple SLC blocks, wherein at least two of the SLC blocks belong to the same plane. In an example embodiment of a two-plane device, memory controller 40 calculates redundancy data over four SLC blocks, wherein two of the four SLC blocks belong to one plane and the other two SLC blocks belong to the other plane. A four-plane example is provided in Table 1 below.

TABLE 1

A scheme for calculating redundancy data for
protecting SLC blocks in a four-plane device.

| PLANE1 | PLANE2 | PLANE3 | PLANE4 |
|---|---|---|---|
| Block_1n | Block_2n | Block_3n | Block_4n |
| Block_1m | Block_2m | Block_3m | Block_4m |

In Table 1, SLC blocks in each column belong to the same plane. Memory controller 40 calculates redundancy data by applying a bitwise XOR operation among the eight SLC blocks to produce redundancy data equivalent in size to one SLC block. This approach reduces the amount of redundancy data required by half, compared to a conventional RAID scheme that would calculate redundancy data by separately XORing among the SLC blocks in each row of Table 1.

Table 2 below depicts a recovery scheme applicable in a two-plane device.

TABLE 2

A scheme for calculating redundancy data for
protecting SLC blocks in a two-plane device.

| PLANE1 | PLANE2 |
|---|---|
| Block_1n | Block_2n |
| Block_1m | Block_2m |
| Block_1k | Block_2k |

In the example of Table 2, memory controller 40 calculates first redundancy data over the SLC blocks Block1n, Block_2n and Block_1m, and calculates second redundancy data over the SLC blocks Block_2m, Block_1k and Block_2k. This scheme thus reduces the amount of redundancy data from one redundancy block per two data blocks to only one redundancy block per three data blocks, a saving of 33r.

The embodiments described above are given by way of example, and other suitable embodiments can also be used. For example, although the embodiments described above refer mainly to calculating redundancy data using bitwise XOR operations, this is not mandatory. In alternative embodiments, other methods for calculating redundancy data can also be used. For example, memory controller 40 may calculate redundancy data using ECC methods such as Reed Solomon or Low-Density Parity-Check (LDPC) encoding.

Although the embodiments described herein mainly address storage and data recovery schemes in a TLC device, the methods and systems described herein can also be used in other applications, such as in storage systems of various possible configurations. The embodiments described above may be applied, for example, to any suitable number of planes per die such as two, four, six or eight planes/die. The embodiments are similarly applicable in calculating redundancy data across multiple dies and across drives. The disclosed techniques are applicable to any suitable type of a multi-level memory device (24) such as QLC and PLC devices having respective 16 and 32 programming levels, or above, e.g., an analog memory storage used in applications such as artificial neural networks and Machine-Learning (ML). In some embodiments, advanced memory technologies employ vertical stacking of layers that are not directly coupled to each other. In such embodiments, memory controller 40 may calculate the redundancy data by XORing also vertically. The 3D XPoint (3DXP)—a nonvolatile memory technology by Intel and Micron, which is based on Phase-Change Memory (PCM) technology, is one such example. As yet another direction, some enterprise Solid State Drives (SSDs) employ MRAM, which is a type of a nonvolatile memory that may be even smaller in footprint than DRAM. In such embodiments, the MRAM may be utilized for temporary data protection.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory system, comprising:
   a Nonvolatile Memory (NVM) comprising multiple memory cells, wherein the memory cells are organized in multiple memory blocks, the memory blocks comprising multiple Word Lines (WLs) of the memory cells; and
   storage circuitry, configured to:
      assign in a recovery scheme, data pages to multiple predefined parity groups, including assigning multiple selected data pages to a given parity group, so that a failing data page in the given parity group is recoverable using remaining data pages assigned to the given parity group, and wherein the multiple selected data pages satisfy the following conditions (i) the selected data pages are of two or more different bit-significance values, and (ii) the selected data pages are stored in a common group of the memory cells belonging to a given WL;
      calculate redundancy data over the data pages of the given parity group in accordance with the recovery scheme;
      store the calculated redundancy data in a dedicated group of the memory cells;
      read a selected data page that belongs to the given parity group; and
      upon detecting a failure in reading the selected data page, identify the given parity group in accordance with the recovery scheme, and recover the selected data page based on other data pages belonging to the given parity group and on the redundancy data calculated for the given parity group.

2. The memory system according to claim 1, wherein the storage circuitry is configured to calculate the redundancy data over at least a first data page having a first bit-significance value and a second data page having a second different bit-significance value, wherein both the first data page and the second data page are stored in the common group of the memory cells.

3. The memory system according to claim 1, wherein the storage circuitry is configured to assign to the given parity group multiple data pages belonging to multiple different groups of the memory cells.

4. The memory system according to claim 3, wherein the multiple groups of the memory cells belong to a same WL across multiple planes of the memory blocks.

5. The memory system according to claim 3, wherein the memory cells are organized in a Three-Dimensional (3D) configuration in which the memory blocks comprise multiple strings, and wherein the multiple groups of the memory cells belong to a same WL across multiple respective strings of a same memory block.

6. The memory system according to claim 1, wherein the storage circuitry is configured to calculate the redundancy data by applying a bitwise XOR operation among the data pages assigned to the given parity group, and to recover the selected page by applying a bitwise XOR operation among the other data pages of the given parity group and the redundancy data.

7. The memory system according to claim 1, wherein the given WL stores four or more data pages of four or more different respective bit-significance values, and wherein the storage circuitry is further configured to:
 assign a first pair of data pages having first and second bit-significance values in the common group of the memory cells to a first parity group; and
 assign a second pair of data pages having third and fourth bit-significance values in the common group of the memory cells to a second parity group, different from the first parity group.

8. A method for data storage, comprising:
 in a storage device, which comprises a Nonvolatile Memory (NVM) comprising multiple memory cells, wherein the memory cells are organized in multiple memory blocks, the memory blocks comprising multiple Word Lines (WLs) of the memory cells:
  assigning in a recovery scheme, data pages to multiple predefined parity groups, including assigning multiple selected data pages to a given parity group, so that a failing data page in the given parity group is recoverable using remaining data pages assigned to the given parity group, and wherein the multiple selected data pages satisfy the following conditions (i) the selected data pages are of two or more different bit-significance values, and (ii) the selected data pages are stored in a common group of the memory cells belonging to a given WL;
  calculating redundancy data over the data pages of the given parity group in accordance with the recovery scheme;
  storing the calculated redundancy data in a dedicated group of the memory cells;
  reading a selected data page that belongs to the given parity group; and
  upon detecting a failure in reading the selected data page, identifying the given parity group in accordance with the recovery scheme, and recovering the selected data page based on other data pages belonging to the given parity group and on the redundancy data calculated for the given parity group.

9. The method according to claim 8, wherein calculating the redundancy data comprises calculating the redundancy data over at least a first data page having a first bit-significance value and a second data page having a second different bit-significance value, wherein both the first data page and the second data page are stored in the common group of the memory cells.

10. The method according to claim 8, wherein assigning the data pages comprises assigning to the given parity group multiple data pages belonging to multiple different groups of the memory cells.

11. The method according to claim 10, wherein the multiple groups of the memory cells belong to a same WL across multiple planes of the memory blocks.

12. The method according to claim 10, wherein the memory cells are organized in a Three-Dimensional (3D) configuration in which the memory blocks comprise multiple strings, and wherein the multiple groups of the memory cells belong to a same WL across multiple respective strings of a same memory block.

13. The method according to claim 8, wherein calculating the redundancy data comprises applying a bitwise XOR operation among the data pages assigned to the given parity group, and wherein recovering the selected page comprises applying a bitwise XOR operation among the other data pages of the given parity group and the redundancy data.

14. The method according to claim 8, wherein the given WL stores four or more data pages of four or more different respective bit-significance values, and wherein assigning the data pages comprises assigning a first pair of data pages having first and second bit-significance values in the common group of the memory cells to a first parity group, and further assigning a second pair of data pages having third and fourth bit-significance values in the common group of the memory cells to a second parity group, different from the first parity group.

15. A memory controller, comprising:
 an interface, configured to communicate with a Nonvolatile Memory (NVM) comprising multiple memory cells, wherein the memory cells are organized in multiple memory blocks, the memory block comprising multiple Word Lines (WLs) of the memory cells; and
 a processor, configured to:
  assign in a recovery scheme, data pages to multiple predefined parity groups, including assigning multiple selected data pages to a given parity group, so that a failing data page in the given parity group is recoverable using remaining data pages assigned to the given parity group, and wherein the multiple selected data pages satisfy the following conditions (i) the selected data pages are of two or more different bit-significance values, and (ii) the selected data pages are stored in a common group of the memory cells belonging to a given WL;
  calculate redundancy data over the data pages of the given parity group in accordance with the recovery scheme;
  store the calculated redundancy data in a dedicated group of the memory cells, via the interface;
  read, via the interface, a selected data page that belongs to the given parity group; and
  upon detecting a failure in reading the selected data page, identify the given parity group in accordance with the recovery scheme, and recover the selected data page based on other data pages belonging to the given parity group and on the redundancy data calculated for the given parity group.

16. The memory controller according to claim 15, wherein the processor is configured to calculate the redundancy data over at least a first data page having a first bit-significance value and a second data page having a second different bit-significance value, wherein both the first data page and the second data page are stored in the common group of the memory cells.

17. The memory controller according to claim 15, wherein the processor is configured to assign to the given parity group multiple data pages belonging to multiple different groups of the memory cells.

18. The memory controller according to claim 17, wherein the multiple groups of the memory cells belong to a same WL across multiple planes of the memory blocks.

19. The memory controller according to claim 17, wherein the memory cells are organized in a Three-Dimensional (3D) configuration in which the memory blocks comprise multiple strings, and wherein the multiple groups of the memory cells belong to a same WL across multiple respective strings of a same memory block.

20. The memory controller according to claim 15, wherein the given WL stores four or more data pages of four or more different respective bit-significance values, and wherein the processor is further configured to:
   assign a first pair of data pages having first and second bit-significance values in the common group of the memory cells to a first parity group; and
   assign a second pair of data pages having third and fourth bit-significance values in the common group of the memory cells to a second parity group, different from the first parity group.

* * * * *